(12) United States Patent
Yoshioka et al.

(10) Patent No.: US 12,740,124 B2
(45) Date of Patent: Sep. 15, 2026

(54) SEMICONDUCTOR DEVICE AND METHOD FOR MANUFACTURING

(71) Applicants: Kabushiki Kaisha Toshiba, Tokyo (JP); Toshiba Electronic Devices & Storage Corporation, Tokyo (JP)

(72) Inventors: Akira Yoshioka, Yokohama Kanagawa (JP); Hitoshi Kobayashi, Yamato Kanagawa (JP); Hideki Sekiguchi, Yokohama Kanagawa (JP); Hung Hung, Kawasaki Kanagawa (JP); Yasuhiro Isobe, Narashino Chiba (JP); Toru Sugiyama, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 469 days.

(21) Appl. No.: 18/455,993

(22) Filed: Aug. 25, 2023

(65) Prior Publication Data

US 2024/0321977 A1 Sep. 26, 2024

(30) Foreign Application Priority Data

Mar. 24, 2023 (JP) ................................ 2023-048208

(51) Int. Cl.
*H10D 64/23* (2025.01)
*H10D 30/01* (2025.01)
(Continued)

(52) U.S. Cl.
CPC ......... *H10D 64/251* (2025.01); *H10D 30/015* (2025.01); *H10D 30/47* (2025.01); *H10D 62/8503* (2025.01)

(58) Field of Classification Search
CPC ..... H10D 64/251; H10D 30/015; H10D 30/47
See application file for complete search history.

(56) References Cited

U.S. PATENT DOCUMENTS 7,038,252 B2 5/2006 Saito et al.
10,074,739 B2 9/2018 Yoshioka et al.
(Continued)

FOREIGN PATENT DOCUMENTS

JP 4041075 B2 1/2008
JP 6422909 B2 11/2018
JP 2022-030079 A 2/2022

*Primary Examiner* — Errol V Fernandes
(74) *Attorney, Agent, or Firm* — Kim & Stewart LLP

(57) ABSTRACT

A semiconductor device includes a first semiconductor layer, a second semiconductor layer, a first electrode, a second electrode, a conductive part, an insulating part, and a third electrode. The second semiconductor layer is located on the first semiconductor layer. The first electrode is located on the second semiconductor layer. The first electrode includes an electrode part and an electrode extension part. The electrode part contacts the second semiconductor layer. The electrode extension part extends from an upper end portion of the electrode part. The conductive part is positioned between the first electrode and the second electrode. The conductive part contacts an upper surface of the second semiconductor layer and contacting the first electrode. The insulating part is located on the conductive part and is positioned between the conductive part and the electrode extension part.

18 Claims, 10 Drawing Sheets

(51) Int. Cl.
*H10D 30/47* (2025.01)
*H10D 62/85* (2025.01)

(56) References Cited

U.S. PATENT DOCUMENTS

| | | | | |
|---|---|---|---|---|
| 2016/0351676 | A1* | 12/2016 | Kaneko | H10D 30/475 |
| 2017/0338810 | A1* | 11/2017 | Chen | H10D 30/475 |
| 2020/0161464 | A1* | 5/2020 | Kamada | H10D 64/411 |
| 2022/0045202 | A1 | 2/2022 | Kajiwara et al. | |

* cited by examiner 41f
190
41
21f
21
21e
12
E
E
E
E
11
De G 41f
190
41
21fx
E1
21f
21
e
E
21e
E
12
E
E
11
De G 41f
190
41
E1
21f
E2
21
e
E
21e
E
12
E
E
11
De G

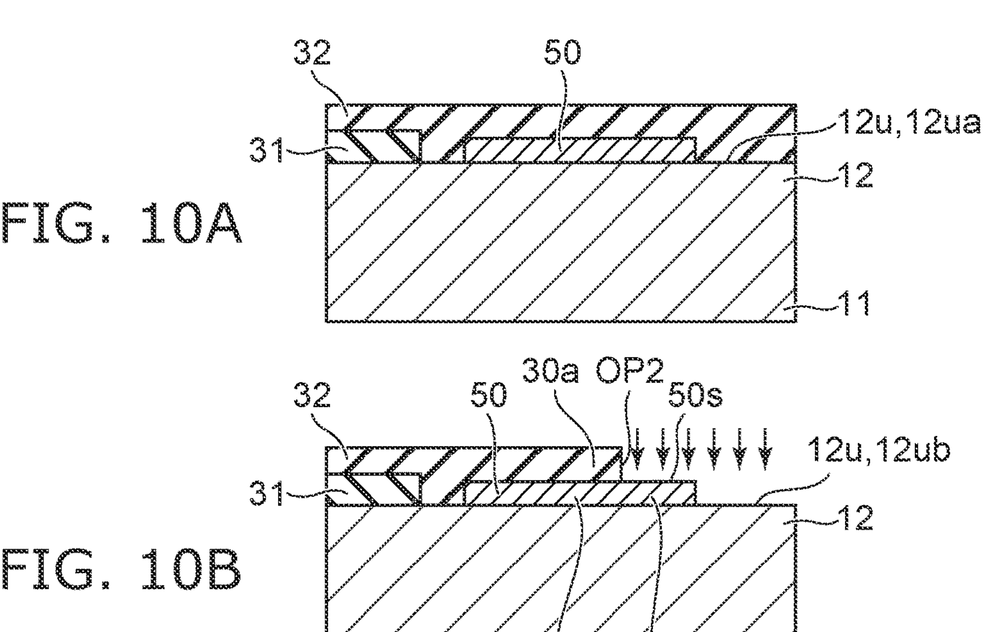
FIG. 10A
FIG. 10B
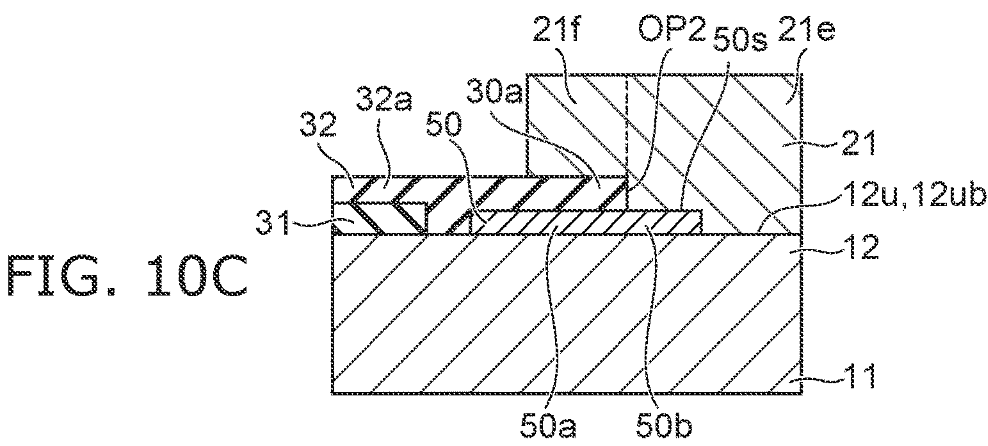
FIG. 10C
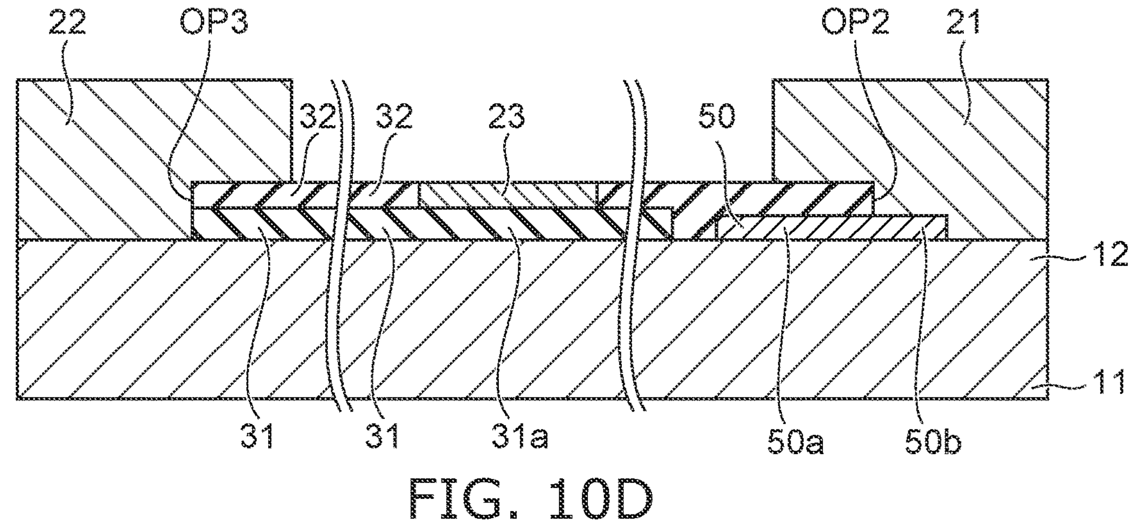
FIG. 10D

SEMICONDUCTOR DEVICE AND METHOD FOR MANUFACTURING

CROSS-REFERENCE TO RELATED APPLICATIONS

This application is based upon and claims the benefit of priority from Japanese Patent Application No. 2023-048208, filed on Mar. 24, 2023; the entire contents of which are incorporated herein by reference.

FIELD

Embodiments relate to a semiconductor device and a method for manufacturing.

BACKGROUND

In a semiconductor device such as a transistor or the like that uses a nitride semiconductor, there are cases where a characteristic change such as an on-resistance increase or the like may occur due to, for example, repeated switching operations, etc.

BRIEF DESCRIPTION OF THE DRAWINGS

FIGS. 10A to 10D are schematic cross-sectional views illustrating manufacturing processes of the semiconductor device according to the embodiment.

DETAILED DESCRIPTION

Figure 1:
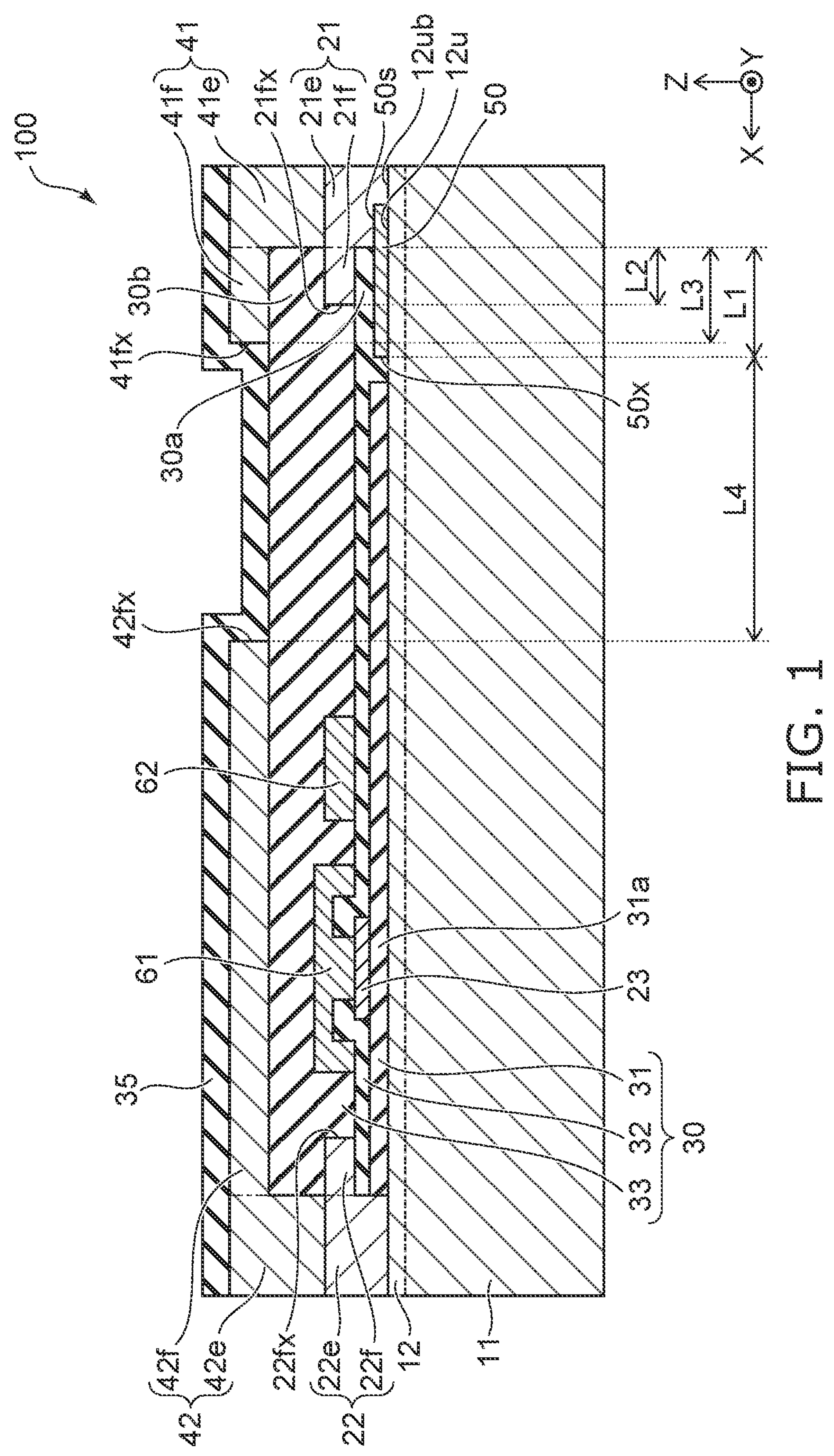
FIG. 1 is a schematic cross-sectional view illustrating a semiconductor device according to an embodiment.

A semiconductor device according to one embodiment, includes a first semiconductor layer, a second semiconductor layer, a first electrode, a second electrode, a conductive part, an insulating part, and a third electrode. The first semiconductor layer includes a nitride semiconductor. The second semiconductor layer is located on the first semiconductor layer. The second semiconductor layer includes a nitride semiconductor. The first electrode is located on the second semiconductor layer. The first electrode includes an electrode part and an electrode extension part. The electrode part contacts the second semiconductor layer. The electrode extension part extends from an upper end portion of the electrode part in a second direction perpendicular to a first direction. The first direction is from the first semiconductor layer toward the second semiconductor layer. The second electrode is located on the second semiconductor layer. The second electrode is separated from the first electrode in the second direction. The conductive part is positioned between the first electrode and the second electrode. The conductive part contacts an upper surface of the second semiconductor layer and contacting the first electrode. A length along the second direction from the electrode part to an end portion of the conductive part at the second electrode side is greater than a length along the second direction from the electrode part to an end portion of the electrode extension part at the second electrode side. The insulating part is located on the conductive part and is positioned between the conductive part and the electrode extension part. The third electrode is positioned above the second semiconductor layer with an insulating film part interposed. The third electrode is positioned between the first electrode and the second electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic cross-sectional view illustrating a semiconductor device according to an embodiment.

Figure 2:
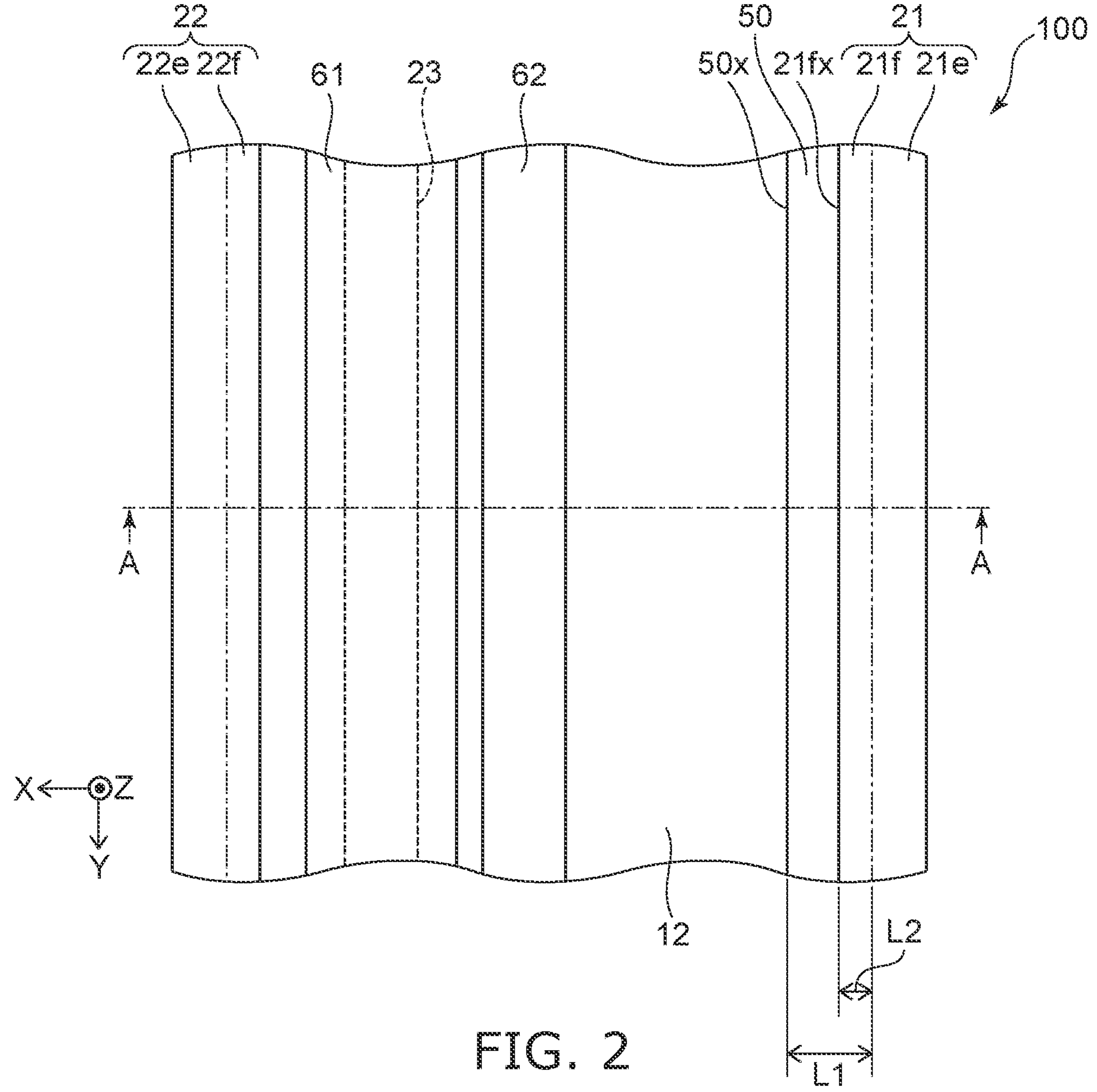
FIG. 2 is a schematic plan view illustrating the semiconductor device according to the embodiment.

FIG. 2 is a schematic plan view illustrating the semiconductor device according to the embodiment.

FIG. 1 corresponds to a cross section along line A-A shown in FIG. 2.

In FIGS. 1 and 2, a HEMT (High Electron Mobility Transistor) is illustrated as an example of the semiconductor device 100 according to the embodiment. As illustrated in FIG. 1, the semiconductor device 100 includes a first semiconductor layer 11, a second semiconductor layer 12, a first electrode 21, a second electrode 22, a third electrode 23, an insulating layer 30, and a conductive part 50. The semiconductor device 100 further includes a wiring layer 41 (a first wiring layer) and a wiring layer 42.

A portion of the components such as the wiring layer 41, the wiring layer 42, the insulating layer 30, etc., are not illustrated in FIG. 2.

An XYZ orthogonal coordinate system is used in the description of embodiments. The direction from the first semiconductor layer 11 toward the second semiconductor layer 12 is taken as a Z-direction (a first direction). Two mutually-orthogonal directions perpendicular to the Z-direction are taken as an X-direction and a Y-direction. In the description, the direction from the first semiconductor layer 11 toward the second semiconductor layer 12 may be called "up", and the opposite direction may be called "down". These directions are based on the relative positional relationship between the first semiconductor layer 11 and the second semiconductor layer 12 and are independent of the direction of gravity.

The first semiconductor layer 11 includes a nitride semiconductor. The second semiconductor layer 12 is located on the first semiconductor layer 11 and contacts the first semiconductor layer 11. The second semiconductor layer 12 includes a nitride semiconductor. For example, the first semiconductor layer 11 and the second semiconductor layer 12 form a heterojunction.

The first electrode 21 is, for example, a drain electrode. The first electrode 21 is located on a portion of the second semiconductor layer 12. The first electrode 21 has an ohmic contact with the upper surface of the second semiconductor layer 12 and is electrically connected with the second semiconductor layer 12.

The first electrode 21 includes a first electrode part 21*e* and a first electrode extension part 21*f*. The lower end portion of the first electrode part 21*e* contacts the upper surface of the second semiconductor layer 12. The first electrode extension part 21*f* extends from the upper end portion of the first electrode part 21*e* toward the second electrode 22 side along the X-direction. For example, the first electrode part 21*e* and the first electrode extension part 21*f* may be one conductive layer (metal layer) formed from the same material to have a continuous body.

The conductive part 50 is located on the second semiconductor layer 12 and contacts an upper surface 12*u* of the second semiconductor layer 12. The conductive part 50 may have an ohmic contact or may not have an ohmic contact (may have, for example, a Schottky contact) with the second semiconductor layer 12. The conductive part 50 is positioned between the first electrode 21 and the second electrode 22 and contacts the first electrode 21. More specifically, as illustrated in FIG. 1, a portion of the conductive part 50 is located between the first electrode part 21*e* and the second semiconductor layer 12 and is covered with the first electrode part 21*e*. That is, a portion of the first electrode part 21*e* contacts an upper surface 50*s* of a portion of the conductive part 50. In the example, the conductive part 50 extends in the Y-direction along the first electrode 21 as illustrated in FIG. 2.

As illustrated in FIG. 1, the conductive part 50 extends further from the first electrode part 21*e* toward the second electrode 22 side than the first electrode extension part 21*f*. In other words, a length L1 (the length along the X-direction from the first electrode part 21*e* to an end portion 50*x* of the conductive part 50 at the second electrode 22 side) is greater than a length L2 (the length along the X-direction from the first electrode part 21*e* to an end portion 21*fx* of the first electrode extension part 21*f* at the second electrode 22 side). The end 25 portion 21*fx* of the first electrode extension part 21*f* is arranged with (overlaps) the conductive part 50 in the Z-direction.

The wiring layer 41 is located on the first electrode 21 and is electrically connected with the first electrode 21. The wiring layer 41 includes a wiring part 41*e* (a first wiring part) and a wiring extension part 41*f* (a first wiring extension part). The lower end portion of the wiring part 41*e* contacts the upper end portion of the first electrode part 21*e*. The wiring extension part 41*f* extends from the upper end portion of the wiring part 41*e* toward the second electrode 22 side along the X-direction. For example, the wiring part 41*e* and the wiring extension part 41*f* may be one conductive layer (metal layer) formed from the same material to have a continuous body.

In the example, the wiring extension part 41*f* extends further from the wiring part 41*e* toward the second electrode 22 side than the first electrode extension part 21*f*. For example, a length L3 (the length along the X-direction from the first electrode part 21*e* to an end portion 41*fx* of the wiring extension part 41*f* at the second electrode 22 side) is greater than the length L2 described above. For example, the conductive part 50 extends further from the first electrode part 21*e* toward the second electrode 22 side than the wiring extension part 41*f*. For example, the length L1 described above is greater than the length L3. The end portion 41*fx* of the wiring extension part 41*f* is arranged with the conductive part 50 in the Z-direction and is not arranged with the first electrode extension part 21*f* in the Z-direction.

The second electrode 22 is, for example, a source electrode. The second electrode 22 is located on a portion of the second semiconductor layer 12. The second electrode 22 is separated from the first electrode 21 in the X-direction. The second electrode 22 has an ohmic contact with the upper surface of the second semiconductor layer 12 and is electrically connected with the second semiconductor layer 12.

For example, the second electrode 22 includes a second electrode part 22*e* and a second electrode extension part 22*f*. The lower end portion of the second electrode part 22*e* contacts the upper surface of the second semiconductor layer 12. The second electrode extension part 22*f* extends from the upper end portion of the second electrode part 22*e* toward the first electrode 21 side along the X-direction. For example, the second electrode part 22*e* and the second electrode extension part 22*f* may be one conductive layer (metal layer) formed from the same material to have a continuous body.

The wiring layer 42 is located on the second electrode 22 and is electrically connected with the second electrode 22. The wiring layer 42 (the second wiring layer) includes a wiring part 42*e* (a second wiring part) and a wiring extension part 42*f* (a second wiring extension part). The lower end portion of the wiring part 42*e* contacts the upper end portion of the second electrode part 22*e*. The wiring extension part 42*f* extends from the upper end portion of the wiring part 42*e* toward the first electrode 21 side along the X-direction. For example, the wiring part 42*e* and the wiring extension part 42*f* may be one conductive layer (metal layer) formed from the same material to have a continuous body.

The wiring extension part 42*f* extends further from the wiring part 42*e* toward the first electrode 21 side than the second electrode extension part 22*f* and covers the second electrode 22. In other words, an end portion 42*fx* of the wiring extension part 42*f* at the first electrode 21 side is positioned between the first electrode 21 and an end portion 22*fx* of the second electrode extension part 22*f* at the first electrode 21 side in the X-direction.

The wiring extension part 42*f* extends further toward the first electrode 21 than the third electrode 23 and covers the third electrode 23, a conductive member 61, and a conductive member 62. In other words, the end portion 42*fx* of the wiring extension part 42*f* is positioned between the third electrode 23 and the first electrode 21 in the X-direction. For example, the wiring extension part 42*f* functions as a field plate electrode.

The third electrode 23 is, for example, a gate electrode. The third electrode 23 is positioned above the second semiconductor layer 12 with an insulating film part 31*a* interposed. That is, the insulating film part 31*a* is located on the second semiconductor layer 12; and the third electrode 23 is located on the insulating film part 31*a*. The third electrode 23 is insulated from the second semiconductor layer 12 by the insulating film part 31*a*. The third electrode 23 is positioned between the second electrode 22 and the first electrode 21.

The third electrode 23 is located more proximate to the second electrode 22 than the first electrode 21. In other words, the distance between the third electrode 23 and the first electrode 21 is greater than the distance between the third electrode 23 and the second electrode 22.

In the example, the conductive member 61 is located above the third electrode 23. The conductive member 61 is electrically connected with the third electrode 23 and covers the third electrode 23. The conductive member 62 is located between the conductive member 61 and the first electrode 21. For example, the conductive member 62 is electrically connected with the second electrode 22 by a not-illustrated connection part. For example, the conductive member 61 and the conductive member 62 function as field plate electrodes.

The third electrode 23 is insulated from the first and second electrodes 21 and 22 by the insulating layer 30. In the example, the insulating layer 30 includes a first insulating film 31 located on the second semiconductor layer 12, a second insulating film 32 located on the first insulating film 31, and a third insulating film 33 located on the second insulating film 32. Thus, the insulating layer 30 may have a stacked structure.

The first insulating film 31 and the second insulating film 32 are located between the first electrode part 21*e* and the second electrode part 22*e*. The insulating film part 31*a* described above is a portion of the first insulating film 31. The third electrode 23 is located on the first insulating film 31. A portion of the second insulating film 32 is located on a portion of the conductive part 50. The conductive member 61, the conductive member 62, the first electrode extension part 21*f*, and the second electrode extension part 22*f* are located on the second insulating film 32. The third insulating film 33 is located between the wiring part 41*e* and the wiring part 42*e* and covers the conductive member 61, the conductive member 62, the first electrode extension part 21*f*, and the second electrode extension part 22*f*. The wiring extension part 41*f* and the wiring extension part 42*f* are located on the third insulating film 33.

As illustrated in FIG. 1, the semiconductor device 100 includes a first insulating portion 30*a* and a second insulating portion 30*b*. The first insulating portion 30*a* and the second insulating portion 30*b* are portions of the insulating layer 30. More specifically, in the example, the first insulating portion 30*a* is a portion of the second insulating film 32; and the second insulating portion 30*b* is a portion of the third insulating film 33.

The first insulating portion 30*a* is located on a portion of the conductive part 50. The first insulating portion 30*a* contacts the side surface of the first electrode part 21*e* and the upper surface of the conductive part 50. A portion of the first insulating portion 30*a* is positioned between the conductive part 50 and the first electrode extension part 21*f*. The second insulating portion 30*b* contacts the side surface of the wiring part 41*e*, the upper surface of the first electrode extension part 21*f*, and the upper surface of the first insulating portion 30*a*. The second insulating portion 30*b* is positioned between the wiring extension part 41*f* and the first insulating portion 30*a*.

An insulating layer 35 is located on the wiring layer 41, the wiring layer 42, and the insulating layer 30.

An example of materials of the components of the semiconductor device 100 will now be described.

The first semiconductor layer 11 includes, for example, $Al_{x1}Ga_{1-x1}N$ ($0 \le x1 < 1$). A composition ratio x1 of Al in the first semiconductor layer 11 is, for example, not less than 0 and not more than 0.01. The first semiconductor layer 11 may be, for example, GaN.

The second semiconductor layer 12 includes, for example, $Al_{x2}Ga_{1-x2}N$ ($x1 < x2 < 1$). The composition ratio x2 of Al in the second semiconductor layer 12 is, for example, not less than 0.1 and not more than 0.4.

The insulating layer 30 (the first insulating film 31, the second insulating film 32, and the third insulating film 33) and the insulating layer 35 include at least one of silicon nitride or silicon oxide.

The first electrode 21 includes, for example, at least one selected from the group consisting of Ti and Al. The second electrode 22 includes, for example, at least one selected from the group consisting of Ti and Al.

The wiring layer 41 and the wiring layer 42 include, for example, at least one selected from the group consisting of Ti, Al, Au, and W.

The third electrode 23 includes, for example, at least one selected from the group consisting of Al, Ti, TiN, TiW, WN, Pt, Ni, In, and Au.

The conductive member 61 and the conductive member 62 include, for example, at least one selected from the group consisting of Al, Cu, Au, and Ag.

The conductive part 50 includes, for example, at least one selected from the group consisting of Al, Ti, TiN, TiW, WN, Pt, Ni, In, and Au. The conductive part 50 is, for example, a metal layer. For example, the material of the conductive part 50 may be different from the material of the first electrode 21 (the first electrode part 21*e*). For example, the electrical resistivity (Ω·cm) of the first electrode 21 may be less than the electrical resistivity of the conductive part 50. The conductive part 50 may include the same material as the first electrode 21.

Operations of the semiconductor device 100 will now be described.

A positive voltage with respect to the second electrode 22 is applied to the first electrode 21. For example, a two-dimensional electron gas (2DEG) is generated in the first semiconductor layer 11 at the vicinity of the interface between the first semiconductor layer 11 and the second semiconductor layer 12. The concentration of the two-dimensional electron gas below the third electrode 23 can be controlled by controlling the voltage of the third electrode 23 referenced to the voltage of the second electrode 22. For example, a two-dimensional electron gas is generated below the third electrode 23 when the voltage of the third electrode 23 is not less than a threshold (e.g., 0 V). An on-state is thereby obtained in which electrons flow from the second electrode 22 toward the first electrode 21 via the first semiconductor layer 11. When the voltage of the third electrode 23 is less than the threshold (e.g., negative), the concentration of the two-dimensional electron gas below the third electrode 23 decreases, and, for example, the two-dimensional electron gas is substantially not generated below the third electrode 23. An off-state is thereby obtained in which electrons substantially do not flow from the second electrode 22 toward the first electrode 21 via the first semiconductor layer 11. Although a normally-on device in which the on-state is obtained when the third electrode 23 is 0 V is illustrated in the example, the embodiment may be a normally-off device in which the off-state is obtained when the third electrode 23 is 0 V.

Effects of the embodiment will now be described with reference to a reference example.

Figures 3A, 3B, 3C:
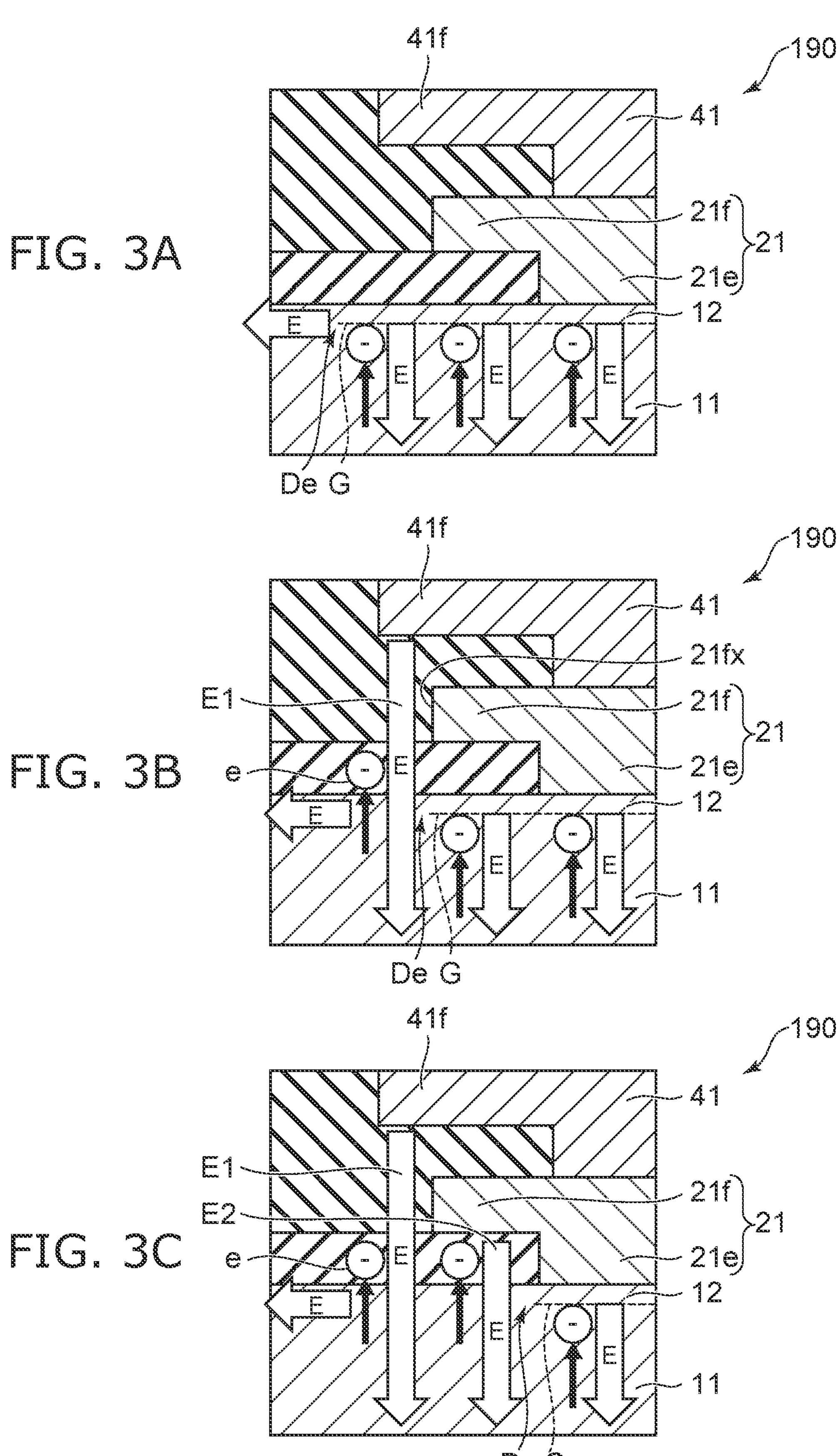
FIGS. 3A to 3C are schematic cross-sectional views illustrating a semiconductor device according to the reference example.

FIGS. 3A to 3C are schematic cross-sectional views illustrating a semiconductor device according to the reference example.

FIGS. 3A to 3C illustrate the periphery of a first electrode 21 of the semiconductor device 190 according to the reference example. The semiconductor device 190 differs from the semiconductor device 100 according to the embodiment in that the conductive part 50 is not included.

FIG. 3A illustrates a state in which a positive voltage with respect to the second electrode 22 is applied to the first electrode 21 in the off-state. FIG. 3B is a state in which the voltage that is applied to the first electrode 21 is greater than the voltage of FIG. 3A. FIG. 3C is a state in which the voltage that is applied to the first electrode 21 is even greater than the voltage of FIG. 3B.

As illustrated in FIG. 3A, a two-dimensional electron gas G is formed at a portion between the first semiconductor layer 11 and the second semiconductor layer 12. An end portion De of a depletion layer is positioned at the third electrode 23 side of the two-dimensional electron gas G. When the voltage of the first electrode 21 becomes large, the region where the two-dimensional electron gas G is formed becomes narrow as illustrated in FIG. 3B; and the end portion De of the depletion layer approaches the first electrode 21. In FIG. 3B, the end portion De is positioned at the vicinity below the end portion 21*fx* of the first electrode extension part 21*f*. At this time, an electric field E1 is generated along the Z-direction between the second semiconductor layer 12 and the wiring extension part 41*f*. When the voltage of the first electrode 21 increases further, the region where the two-dimensional electron gas G is formed becomes narrower as illustrated in FIG. 3C; and the end portion De of the depletion layer approaches the first electrode part 21*e*. In FIG. 3C, the end portion De is positioned at the vicinity below the side surface of the first electrode part 21*e*. At this time, an electric field E2 is generated along the Z-direction between the second semiconductor layer 12 and the first electrode extension part 21*f*.

Thus, when the depletion layer reaches the periphery of the first electrode 21, a strong vertical electric field is generated between the second semiconductor layer 12 and the first electrode extension part 21*f* and between the second semiconductor layer 12 and the wiring extension part 41*f*.

Figure 4A:
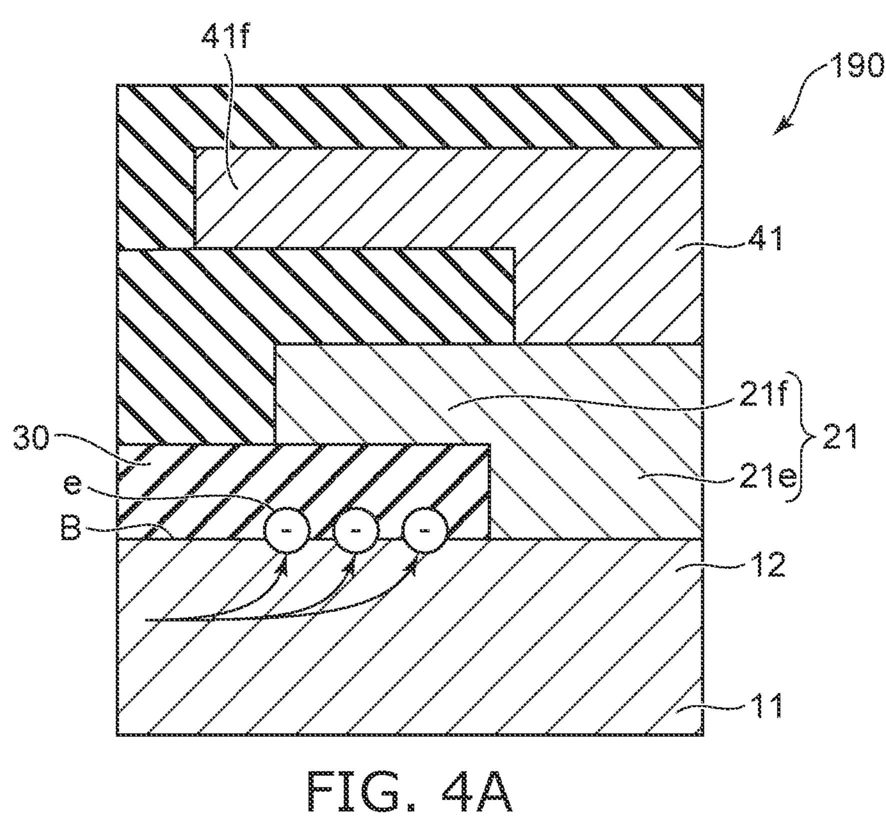
FIGS. 4A and 4B are schematic cross-sectional views illustrating semiconductor devices.
Figure 4B:
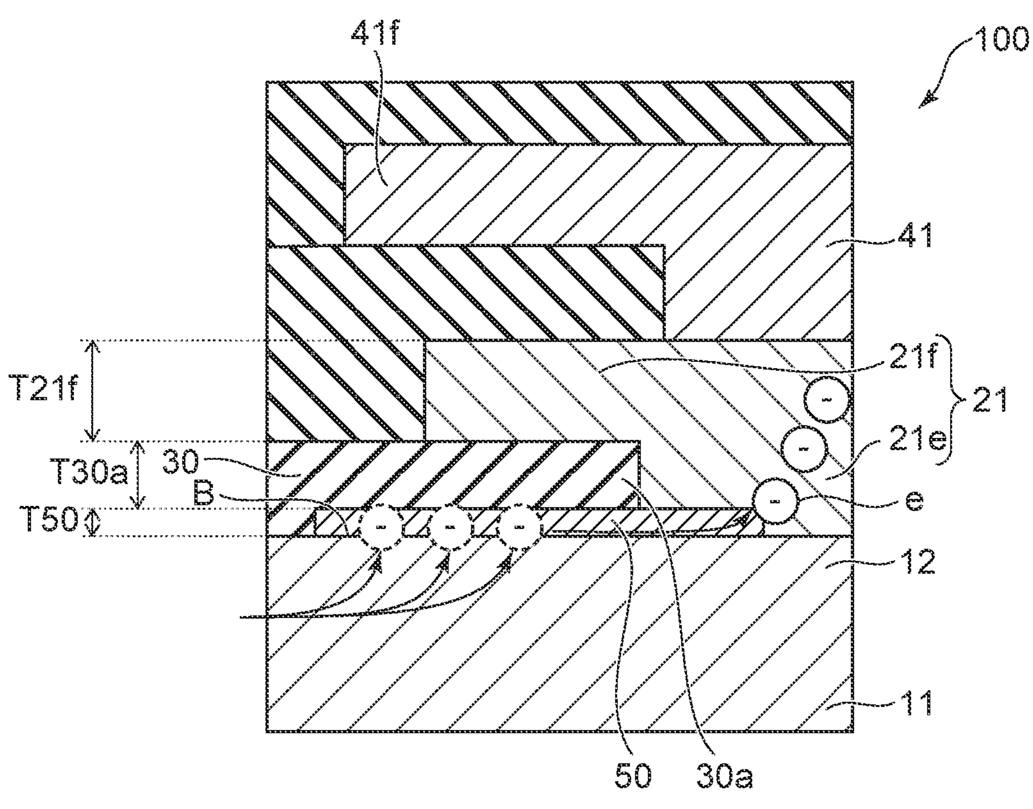

FIGS. 4A and 4B are schematic cross-sectional views illustrating semiconductor devices.

FIG. 4A illustrates the semiconductor device 190; and FIG. 4B illustrates the semiconductor device 100.

As illustrated in FIG. 4A, electrons e from the second semiconductor layer 12 are injected by the vertical electric field described with reference to FIGS. 3A to 3C into the insulating layer 30 and into an interface B between the second semiconductor layer 12 and the insulating layer 30. The electrons e that are injected are trapped in the insulating layer 30 and/or the interface B. For example, there is a risk that the trapped electrons e may affect the two-dimensional electron gas formed at the interface between the first semiconductor layer 11 and the second semiconductor layer 12 in the on-state. For example, it is considered that the electric field generated by the electrons e reduces the electron density of the two-dimensional electron gas and increases the on-resistance.

In contrast, according to the embodiment, the conductive part 50 that contacts the first electrode 21 is located on the second semiconductor layer 12; and the length L1 is greater than the length L2 of the first electrode extension part 21*f* as described with reference to FIG. 1. As illustrated in FIG. 4B, for example, the electrons e from the second semiconductor layer 12 that reach the conductive part 50 positioned below the first electrode extension part 21*f* are discharged from the conductive part 50 to the first electrode 21. The electrons e that are trapped in the insulating layer 30 and/or the interface B can be suppressed by the conductive part 50; therefore, the increase of the on-resistance can be suppressed. According to the embodiment, for example, current collapse can be suppressed, and stable characteristics can be obtained.

As described with reference to FIG. 1, for example, the length L1 of the conductive part 50 may be greater than the length L3 of the wiring extension part 41*f*. Thus, by forming a wide conductive part 50, the electrons e that are trapped in the insulating layer 30 and/or the interface B can be further suppressed. However, according to the embodiment, the length L3 may be greater than the length L1. The electrical resistance of the wiring layer 41 can be suppressed when the length L3 is long.

Although not illustrated, another wiring layer 41 may be stacked on the wiring layer 41. The length L3 of the wiring extension part 41*f* of each wiring layer 41 may be, for example, greater than the length L2 of the first electrode extension part 21*f* and less than the length L1 of the conductive part 50.

As illustrated in FIG. 1, the first electrode part 21*e* contacts the upper surface 50*s* of a portion of the conductive part 50 and the upper surface 12*u* of the second semiconductor layer 12. That is, the first electrode part 21*e* contacts the upper surface of the conductive part 50 and contacts the upper surface of the second semiconductor layer 12. Thus, for example, the first electrode part 21*e* more reliably contacts both the conductive part 50 and the second semiconductor layer 12.

For example, as illustrated in FIG. 4B, a thickness T50 (the length along the Z-direction) of the conductive part 50 is less than a thickness T21*f* of the first electrode extension part 21*f* and less than a thickness T30*a* of the first insulating portion 30*a*. By making the conductive part 50 relatively thin, for example, the thickness of the first electrode 21 can be suppressed, and the increase of the Z-direction resistance component is suppressed.

The conductive part 50 may be located at the periphery of the first electrode 21. For example, as illustrated in FIG. 1, the end portion 50*x* of the conductive part 50 is between the end portion 41*fx* of the wiring extension part 41*f* and the end portion 42*fx* of the wiring extension part 42*f* in the X-direction. A length L4 along the X-direction between the end portion 50*x* of the conductive part 50 and the end portion 42*fx* of the wiring extension part 42*f* is greater than the difference between the length L1 and the length L3 and greater than the difference between the length L1 and the length L2. For example, the length L4 is greater than the length L1.

FIGS. 5 to 8 are schematic plan views illustrating semiconductor devices according to modifications of the embodiment.

FIGS. 5 to 8 illustrate planar arrangements of the parts around the first electrode 21 in semiconductor devices 101 to 104 according to modifications of the embodiment. The planar shapes of the conductive part 50 and the first electrode 21 of the semiconductor devices 101 to 104 are different from that of the semiconductor device 100 illustrated in FIG. 2.

Figure 5:
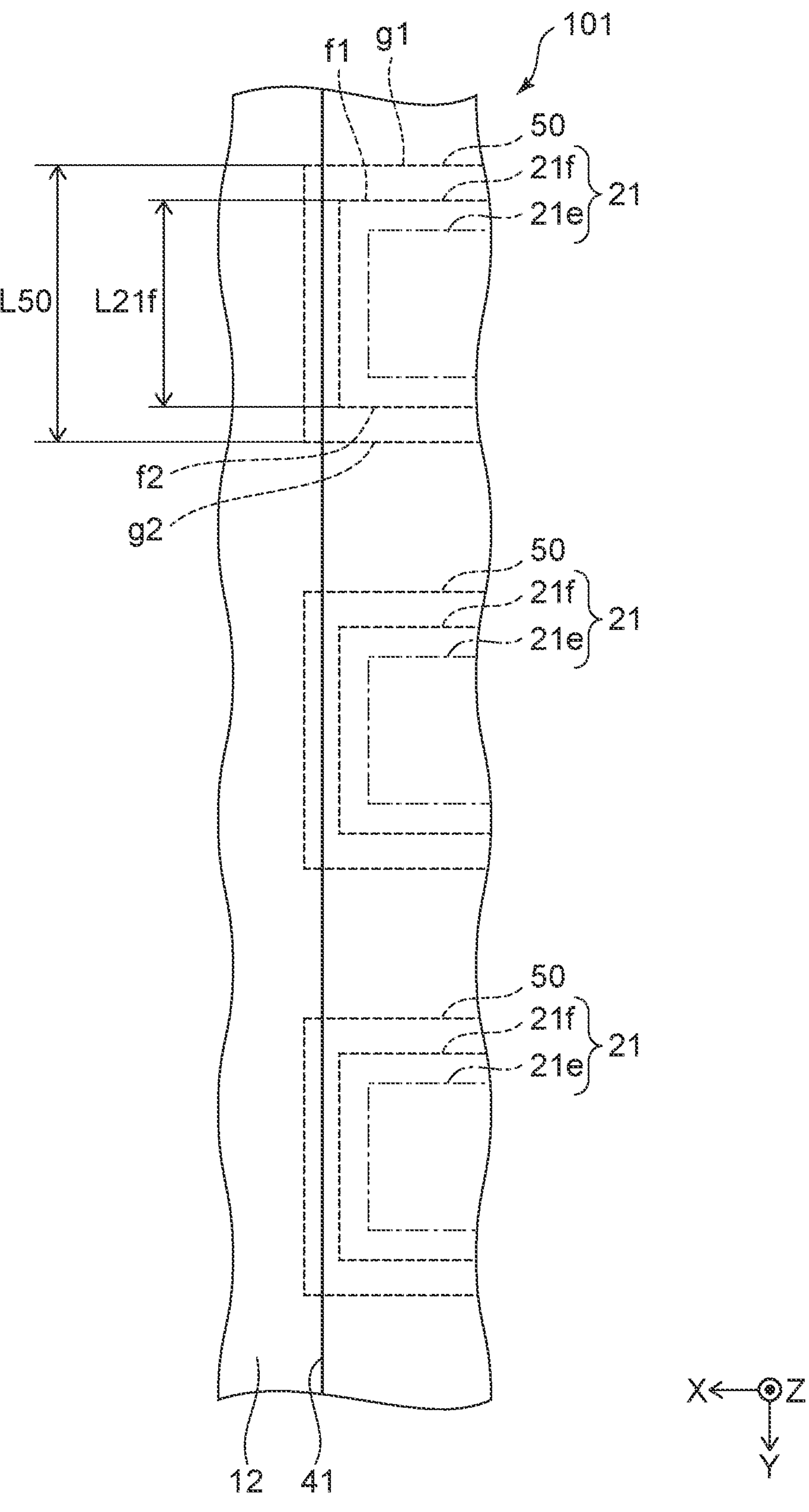
FIG. 5 is a schematic plan view illustrating semiconductor device according to a modification of the embodiment.

The semiconductor device 101 illustrated in FIG. 5 includes multiple first electrodes 21 and multiple conductive parts 50. The multiple first electrodes 21 and the multiple conductive parts 50 are arranged in the Y-direction. The conductive parts 50 are located respectively to contact the first electrodes 21. That is, one conductive part 50 contacts one first electrode 21. One wiring layer 41 extends in the Y-direction and is located on the multiple first electrodes 21. The wiring layer 41 is electrically connected with each first electrode 21.

The outer edge of the first electrode extension part 21*f* may be provided to surround the first electrode part 21*e* when viewed in plan along the Z-direction. The planar shape of the outer edge of the first electrode extension part 21*f* may be, for example, rectangular. In other words, the first electrode extension part 21*f* of the first electrode 21 may extend in four directions (the X-directions and the Y-directions) from the first electrode part 21*e*.

For example, the outer edge of the conductive part 50 may be provided to surround the first electrode 21 when viewed in plan along the Z-direction. The planar shape of the outer edge of the conductive part 50 may be, for example, rectangular. For example, the length L50 along the Y-direction of the conductive part 50 is greater than a length L21*f* along the Y-direction of the first electrode extension part 21*f*. The first electrode extension part 21*f* includes two end portions (an end portion f1 and an end portion f2) in the Y-direction. The end portion f1 and the end portion f2 are located at positions at which the end portion f1 and the end portion f2 overlap the conductive part 50 in the Z-direction. For example, the end portion f1 and the end portion f2 are positioned between the two end portions (an end portion g1 and an end portion g2) in the Y-direction of the conductive part 50 when viewed in plan along the Z-direction. Thus, by forming the conductive part 50 to be wide with respect to the first electrode 21, the electrons e that are trapped in the insulating layer 30, etc., can be further suppressed.

Figure 6:
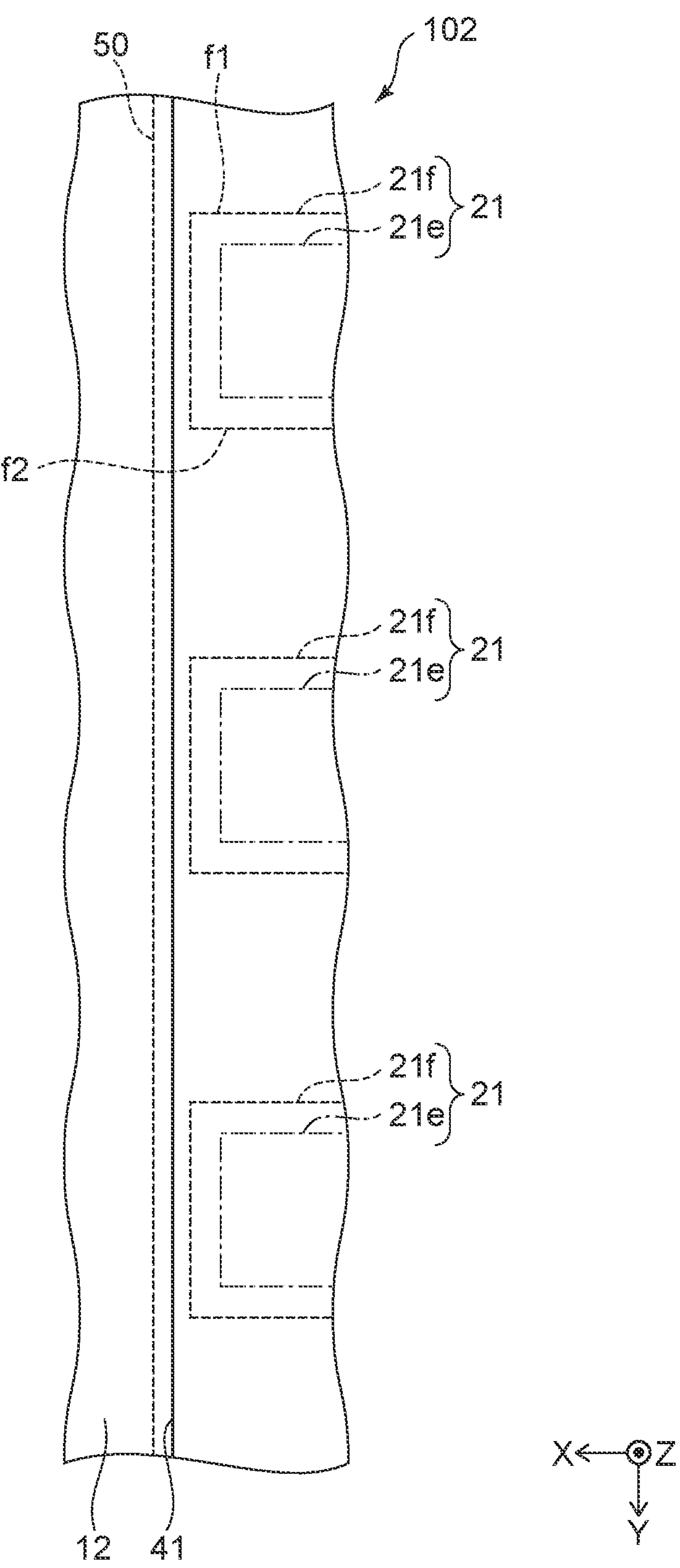
FIG. 6 is a schematic plan view illustrating semiconductor device according to a modification of the embodiment.

In the semiconductor device 102 illustrated in FIG. 6, multiple first electrodes 21 are provided for one conductive part 50. The multiple first electrodes 21 are arranged in the Y-direction. One conductive part 50 extends in the Y-direction and contacts the multiple first electrodes 21.

Figure 7:
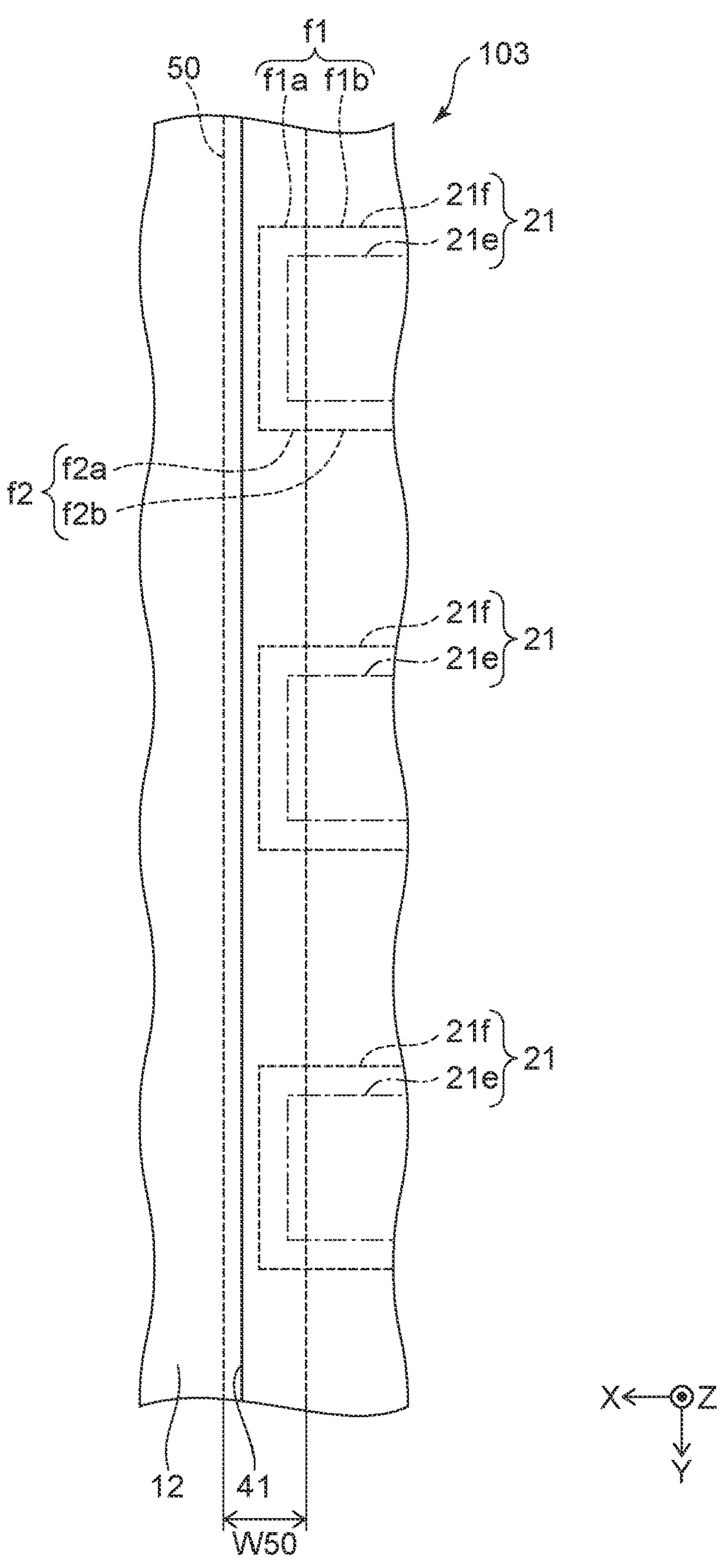
FIG. 7 is a schematic plan view illustrating semiconductor device according to a modification of the embodiment.

A width W50 (the length along the X-direction) of the conductive part 50 of the semiconductor device 103 illustrated in FIG. 7 is less than the width of the conductive part 50 of the semiconductor device 102 illustrated in FIG. 6. In the semiconductor device 103, a portion f1*a* of the end portion f1 (the side) of the first electrode 21 overlaps the conductive part 50 in the Z-direction. On the other hand, another portion f1*b* of the end portion f1 does not overlap the conductive part 50 in the Z-direction. The portion f1*a* is further toward the second electrode 22 side than the portion f1*b*. Similarly, in the semiconductor device 103, a portion f2*a* of the end portion f2 (the side) of the first electrode 21 overlaps the conductive part 50 in the Z-direction. On the other hand, another portion f2*b* of the end portion f2 does not overlap the conductive part 50 in the Z-direction. The portion f2*a* is further toward the second electrode 22 side than the portion f2*b*.

Figure 8:
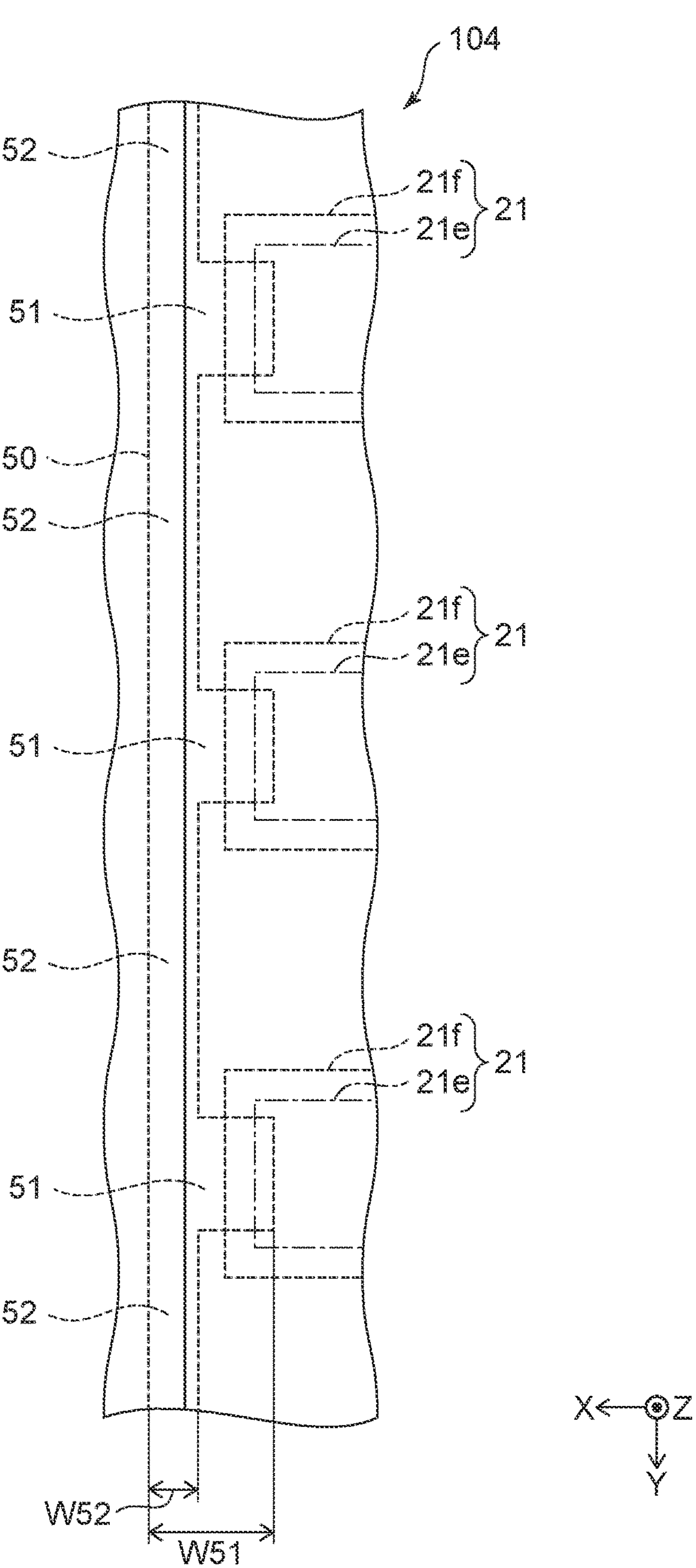
FIG. 8 is a schematic plan view illustrating semiconductor device according to a modification of the embodiment.

In the examples of FIGS. 5 to 7, the width (the length along the X-direction) of the conductive part 50 is, for example, constant. The width of the conductive part 50 is not limited thereto, and may change along the Y-direction as in the semiconductor device 104 illustrated in FIG. 8. For example, in the semiconductor device 104, the conductive part 50 includes multiple wide portions 51 and multiple narrow portions 52 alternately arranged in the Y-direction. A width W51 of the wide portion 51 is greater than a width W52 of the narrow portion 52. The multiple wide portions 51 respectively contact the multiple first electrodes 21 directly. The narrow portion 52 is separated from the first electrode 21. In the example of FIG. 8, the end portion f1 (the side) and the end portion f2 (the side) of the first electrode 21 do not overlap the conductive part 50 in the Z-direction.

FIGS. 9A to 9D and FIGS. 10A to 10D are schematic cross-sectional views illustrating manufacturing processes of the semiconductor device according to the embodiment.

FIGS. 9A to 10C illustrate only the periphery of the region at which the first electrode 21 is formed. FIG. 10D illustrates the periphery of the region at which the first electrode 21, the second electrode 22, and the third electrode 23 are formed.

Figure 9A:
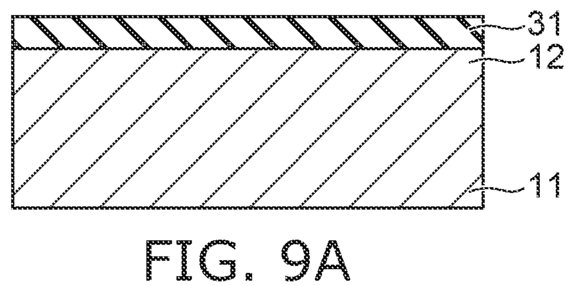
FIGS. 9A to 9D are schematic cross-sectional views illustrating manufacturing processes of the semiconductor device according to the embodiment.

As illustrated in FIG. 9A, the second semiconductor layer 12 is located on the first semiconductor layer 11. Then, the first insulating film 31 is formed on the second semiconductor layer 12 by, for example, LPCVD (Low-Pressure Chemical Vapor Deposition), etc.

Figure 9B:
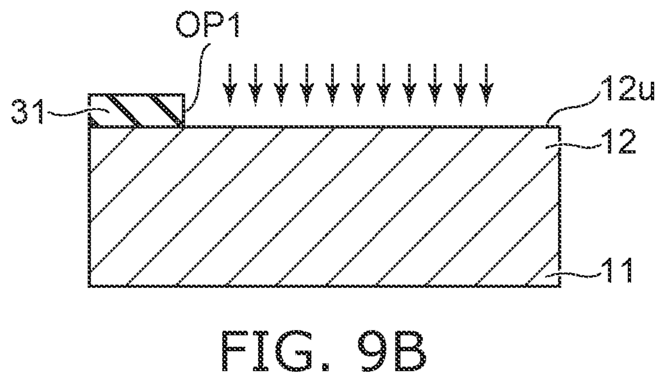

Subsequently, as illustrated in FIG. 9B, an opening OP1 is formed by removing a portion of the first insulating film 31 by, for example, reactive ion etching, etc. The upper surface 12*u* of the second semiconductor layer 12 is exposed in the opening OP1.

Figure 9C:
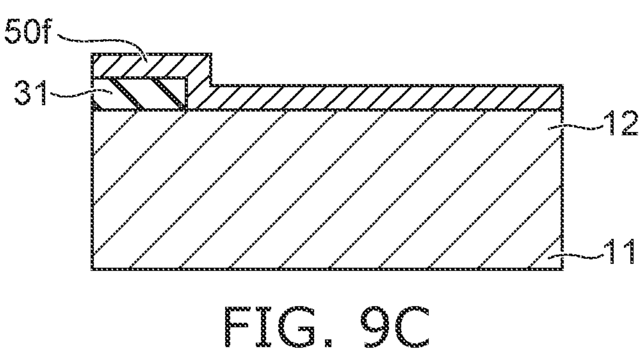

Subsequently, as illustrated in FIG. 9C, a conductive film 50*f* is formed by, for example, sputtering, etc. The conductive film 50*f* is located on the first insulating film 31 and on the upper surface 12*u* of the second semiconductor layer 12.

Figure 9D:
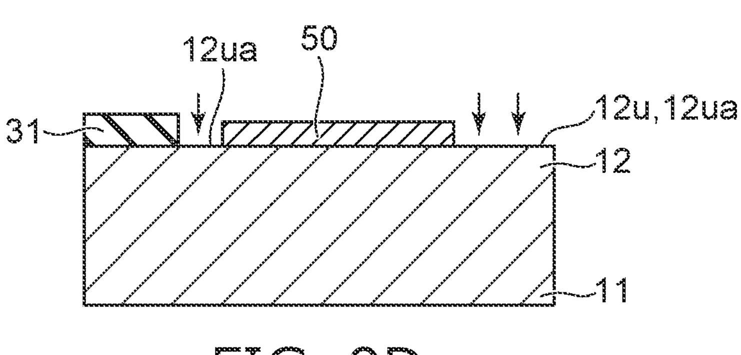

Subsequently, as illustrated in FIG. 9D, a portion of the conductive film 50*f* that is on the first insulating film 31 and on a portion of the upper surface 12*u* of the second semiconductor layer 12 is removed by, for example, wet etching. The upper surface of the first insulating film 31 and a first region 12*ua* which is a portion of the upper surface 12*u* are exposed thereby, and the conductive part 50 is formed.

Subsequently, as illustrated in FIG. 10A, the second insulating film 32 is formed on the first insulating film 31, on the second semiconductor layer 12 (the first region 12*ua* of the upper surface 12*u*), and on the conductive part 50 by, for example, PECVD (Plasma-Enhanced Chemical Vapor Deposition), etc. At this time, for example, the second insulating film 32 covers the entire conductive part 50 and the entire first region 12*ua*.

Subsequently, as illustrated in FIG. 10B, the first insulating portion 30*a* is formed on a first portion 50*a* of the conductive part 50. In other words, an opening OP2 is formed in the second insulating film 32 by removing a portion of the second insulating film 32 from the upper surface 50*s* of an upper surface 12*ub* of a portion of the second semiconductor layer 12 and a second portion 50*b* of the conductive part 50 by, for example, reactive ion etching, etc. The upper surface 50*s* and the upper surface 12*ub* are exposed in the opening OP2. The upper surface 12*ub* is a portion of the first region 12*ua* of the upper surface 12*u*.

Subsequently, as illustrated in FIG. 10C, the first electrode 21 is formed in the opening OP2 and on the first insulating portion 30*a*. Specifically, for example, an electrode film that is used to form the first electrode 21 is formed on the second insulating film 32, the upper surface 50*s*, and the upper surface 12*ub*. The first electrode 21 is formed by removing a portion of the electrode film on a portion 32*a* of the second insulating film 32 by reactive ion etching, etc. The part of the first electrode 21 located on the upper surfaces 50*s* and 12*ub* in the opening OP2 becomes the first electrode part 21*e*. The part of the first electrode 21 located on the first insulating portion 30*a* becomes the first electrode extension part 21*f*.

The second electrode 22 is formed as illustrated in FIG. 10D. For example, the formation of the second electrode 22 may be performed simultaneously with the formation of the first electrode 21. In other words, when forming the opening OP2, an opening OP3 is formed in the first and second insulating films 31 and 32 according to the position at which the second electrode 22 will be formed. The second semiconductor layer 12 is exposed in the opening OP3. Subsequently, the electrode film described above also is formed in the opening OP3; and the second electrode 22 is formed by patterning simultaneously with the first electrode 21 by reactive ion etching, etc.

The third electrode 23 is formed using an appropriate method and timing. For example, the third electrode 23 may be formed by embedding in the second insulating film 32 before forming the first electrode 21 and/or the second electrode 22. Or, the third electrode 23 may be formed before forming the second insulating film 32, and then the second insulating film 32 may be stacked and polished.

According to the embodiment, for example, as described with reference to FIG. 9D, a portion of the conductive film 50*f* is patterned by wet etching. Compared to when dry etching is used, the effects on (the damage of) the second semiconductor layer 12 can be suppressed by using wet etching. For example, a reduction of the carrier density of the two-dimensional electron gas can be suppressed. For example, if the material of the conductive film 50*f* is TiN, a mixed liquid of hydrochloric acid, aqueous hydrogen peroxide, and water or the like can be used as the etchant of the wet etching.

For example, as described with reference to FIG. 10C, the second semiconductor layer 12 and the conductive part 50 are exposed in the opening OP2; and the first electrode part 21*e* is formed on the second semiconductor layer 12 and the conductive part 50. Therefore, for example, the conductive part 50 and the first electrode part 21*e* can be connected more reliably while forming an ohmic junction between the first electrode part 21*e* and the second semiconductor layer 12.

As described above, the material of the first electrode 21 may be different from the material of the conductive part 50. For example, a material that easily forms an ohmic junction with the second semiconductor layer 12 can be selected as the first electrode 21; and a material that is easily patterned by wet etching can be selected as the conductive part 50.

According to embodiments, a semiconductor device can be provided in which stable characteristics can be obtained.

The embodiments may include the following configurations (for example, technical proposals).

Configuration 1

A semiconductor device, comprising:
- a first semiconductor layer including a nitride semiconductor;
- a second semiconductor layer located on the first semiconductor layer, the second semiconductor layer including a nitride semiconductor;
- a first electrode located on the second semiconductor layer, the first electrode including
  - an electrode part contacting the second semiconductor layer, and
  - an electrode extension part extending from an upper end portion of the electrode part in a second direction perpendicular to a first direction, the first direction being from the first semiconductor layer toward the second semiconductor layer;
- a second electrode located on the second semiconductor layer, the second electrode being separated from the first electrode in the second direction;
- a conductive part positioned between the first electrode and the second electrode, the conductive part contacting an upper surface of the second semiconductor layer and contacting the first electrode, a length along the second direction from the electrode part to an end portion of the conductive part at the second electrode side being greater than a length along the second direction from the electrode part to an end portion of the electrode extension part at the second electrode side;
- an insulating part located on the conductive part and positioned between the conductive part and the electrode extension part; and
- a third electrode positioned above the second semiconductor layer with an insulating film part interposed, the third electrode being positioned between the first electrode and the second electrode.

Configuration 2

The device according to Configuration 1, wherein
- the electrode part contacts an upper surface of a portion of the conductive part and contacts the upper surface of the second semiconductor layer.

Configuration 3

The device according to Configuration 1 or 2, further comprising:
- a first wiring layer located on the first electrode,
- the first wiring layer including
  - a first wiring part, and
  - a first wiring extension part extending in the second direction from an upper end portion of the first wiring part,
- a length along the second direction from the electrode part to an end portion of the first wiring extension part at the second electrode side being greater than the length along the second direction from the electrode part to the end portion of the electrode extension part at the second electrode side and less than the length along the second direction from the electrode part to the end portion of the conductive part at the second electrode side.

Configuration 4

The device according to any one of Configurations 1 to 3, further comprising:
- a second wiring layer located on the second electrode,
- the second wiring layer including
  - a second wiring part, and
  - a second wiring extension part extending from an upper end portion of the second wiring part toward the first electrode side,
- a length along the second direction between the end portion of the conductive part at the second electrode side and an end portion of the second wiring extension part at the first electrode side being greater than the length along the second direction from the electrode part to the end portion of the conductive part at the second electrode side.

Configuration 5

The device according to any one of Configurations 1 to 4, further comprising:
- a second wiring layer located on the second electrode,
- the second wiring layer including
  - a second wiring part, and
  - a second wiring extension part extending from an upper end portion of the second wiring part toward the first electrode side,
- a length along the second direction between the end portion of the conductive part at the second electrode side and an end portion of the second wiring extension part at the first electrode side being greater than a difference between the length along the second direction from the electrode part to the end portion of the conductive part at the second electrode side and the length along the second direction from the electrode part to the end portion of the electrode extension part at the second electrode side.

Configuration 6

The device according to Configuration 3, further comprising:

a second wiring layer located on the second electrode, the second wiring layer including a second wiring part, and a second wiring extension part extending from an upper end portion of the second wiring part toward the first electrode side, a length along the second direction between the end portion of the conductive part at the second electrode side and an end portion of the second wiring extension part at the first electrode side being greater than a difference between the length along the second direction from the electrode part to the end portion of the conductive part at the second electrode side and the length along the second direction from the electrode part to the end portion of the first wiring extension part at the second electrode side.

Configuration 7

The device according to any one of Configurations 1 to 6, wherein a plurality of the first electrodes is provided, a plurality of the conductive parts is provided, and the plurality of conductive parts respectively contacts the plurality of first electrodes.

Configuration 8

The device according to any one of Configurations 1 to 6, wherein a plurality of the first electrodes is provided, and one of the conductive parts contacts the plurality of first electrodes.

Configuration 9

The device according to any one of Configurations 1 to 8, wherein a length of the conductive part in a third direction is greater than a length in the third direction of the electrode extension part, the third direction is perpendicular to the first direction and perpendicular to the second direction, and an end portion in the third direction of the electrode extension part is at a position at which the end portion in the third direction of the electrode extension part overlaps the conductive part in the first direction.

Configuration 10

The device according to any one of Configurations 1 to 9, wherein a thickness of the conductive part is less than a thickness of the electrode extension part.

Configuration 11

The device according to any one of Configurations 1 to 10, wherein a material of the conductive part is different from a material of the first electrode.

Configuration 12

The device according to any one of Configurations 1 to 11, further comprising:

a first insulating film located on the second semiconductor layer, the first insulating film including the insulating film part;

a second insulating film located on the first insulating film, a portion of the second insulating film being located on the conductive part; and a third insulating film located on the second insulating film, a portion of the third insulating film being located on the electrode extension part.

Configuration 13

A method for manufacturing a semiconductor device, the method comprising:

forming a conductive part on a portion of a second semiconductor layer, the second semiconductor layer being located on a first semiconductor layer, the first semiconductor layer including a nitride semiconductor, the second semiconductor layer including a nitride semiconductor;

forming an insulating part on a first portion of the conductive part;

forming a first electrode, the first electrode including an electrode part positioned on the second semiconductor layer, the electrode part contacting the second semiconductor layer and the conductive part, and an electrode extension part positioned on the insulating part, the electrode extension part extending in a second direction from an upper end of the electrode part, the second direction being perpendicular to a first direction, the first direction being from the first semiconductor layer toward the second semiconductor layer;

forming a second electrode separated from the first electrode and the conductive part in the second direction, a length along the second direction from the electrode part to an end portion of the conductive part at the second electrode side being greater than a length along the second direction from the electrode part to an end portion of the electrode extension part at the second electrode side; and forming a third electrode positioned above the second semiconductor layer with an insulating film part interposed, the third electrode being positioned between the first electrode and the second electrode.

Configuration 14

The method according to Configuration 13, wherein the forming of the conductive part includes:

forming a conductive film on the second semiconductor layer; and removing a portion of the conductive film by wet etching.

Configuration 15

The method according to Configuration 13 or 14, wherein the forming of the insulating part includes:

forming an insulating film on the second semiconductor layer and the conductive part so that the insulating film covers the conductive part; and forming an opening in the insulating film by removing a portion of the insulating film, and the forming of the first electrode includes forming a portion of the electrode part in the opening.

In the specification of the application, "perpendicular" refers to not only strictly perpendicular but also includes, for example, the fluctuation due to manufacturing processes, etc. It is sufficient to be substantially perpendicular.

In this specification, being "electrically connected" includes not only the case of being connected in direct contact, but also the case of being connected via another conductive member, etc.

The scope of one component being "located on" another component may include not only the case where the two components contact each other (or are continuous), but also the case where another component is located between the two components. For example, the scope of one component being "located on" another component may include the case where one component is positioned above another component regardless of whether or not the two components contact each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
a first semiconductor layer including a nitride semiconductor;
a second semiconductor layer located on the first semiconductor layer, the second semiconductor layer including a nitride semiconductor;
a first electrode located on the second semiconductor layer, the first electrode including
an electrode part contacting the second semiconductor layer, and
an electrode extension part extending from an upper end portion of the electrode part in a second direction perpendicular to a first direction, the first direction being from the first semiconductor layer toward the second semiconductor layer;
a second electrode located on the second semiconductor layer, the second electrode being separated from the first electrode in the second direction;
a conductive part positioned between the first electrode and the second electrode, the conductive part contacting an upper surface of the second semiconductor layer and contacting the first electrode, a length along the second direction from the electrode part to an end portion of the conductive part at the second electrode side being greater than a length along the second direction from the electrode part to an end portion of the electrode extension part at the second electrode side;
an insulating part located on the conductive part and positioned between the conductive part and the electrode extension part; and
a third electrode positioned above the second semiconductor layer with an insulating film part interposed, the third electrode being positioned between the first electrode and the second electrode, wherein
the electrode part contacts an upper surface of a portion of the conductive part and contacts the upper surface of the second semiconductor layer, and
the upper surface of the conductive part includes an edge facing the electrode part in the second direction and a horizontal contact region extending in the second direction from the edge towards the second electrode, and both the edge and the horizontal contact region are in direct contact with the electrode part.

2. The device according to claim 1, further comprising:
a first wiring layer located on the first electrode,
the first wiring layer including
a first wiring part, and
a first wiring extension part extending in the second direction from an upper end portion of the first wiring part,
a length along the second direction from the electrode part to an end portion of the first wiring extension part at the second electrode side being greater than the length along the second direction from the electrode part to the end portion of the electrode extension part at the second electrode side and less than the length along the second direction from the electrode part to the end portion of the conductive part at the second electrode side.

3. The device according to claim 1, further comprising:
a second wiring layer located on the second electrode,
the second wiring layer including
a second wiring part, and
a second wiring extension part extending from an upper end portion of the second wiring part toward the first electrode side,
a length along the second direction between the end portion of the conductive part at the second electrode side and an end portion of the second wiring extension part at the first electrode side being greater than the length along the second direction from the electrode part to the end portion of the conductive part at the second electrode side.

4. The device according to claim 1, further comprising:
a second wiring layer located on the second electrode,
the second wiring layer including
a second wiring part, and
a second wiring extension part extending from an upper end portion of the second wiring part toward the first electrode side,
a length along the second direction between the end portion of the conductive part at the second electrode side and an end portion of the second wiring extension part at the first electrode side being greater than a difference between the length along the second direction from the electrode part to the end portion of the conductive part at the second electrode side and the length along the second direction from the electrode part to the end portion of the electrode extension part at the second electrode side.

5. The device according to claim 2, further comprising:
a second wiring layer located on the second electrode,
the second wiring layer including
a second wiring part, and
a second wiring extension part extending from an upper end portion of the second wiring part toward the first electrode side,
a length along the second direction between the end portion of the conductive part at the second electrode side and an end portion of the second wiring extension part at the first electrode side being greater than a difference between the length along the second direction from the electrode part to the end portion of the conductive part at the second electrode side and the length along the second direction from the electrode part to the end portion of the first wiring extension part at the second electrode side.

6. The device according to claim 1, wherein
a plurality of the first electrodes is provided,
a plurality of the conductive parts is provided, and
the plurality of conductive parts respectively contacts the plurality of first electrodes.

7. The device according to claim 1, wherein
a plurality of the first electrodes is provided, and
one of the conductive parts contacts the plurality of first electrodes.

8. The device according to claim 1, wherein
a length of the conductive part in a third direction is greater than a length in the third direction of the electrode extension part,
the third direction is perpendicular to the first direction and perpendicular to the second direction, and an end portion in the third direction of the electrode extension part is at a position at which the end portion in the third direction of the electrode extension part overlaps the conductive part in the first direction.

9. The device according to claim 1, wherein a thickness of the conductive part is less than a thickness of the electrode extension part.

10. The device according to claim 1, wherein a material of the conductive part is different from a material of the first electrode.

11. The device according to claim 1, further comprising:

a first insulating film located on the second semiconductor layer, the first insulating film including the insulating film part;

a second insulating film located on the first insulating film, a portion of the second insulating film being located on the conductive part; and a third insulating film located on the second insulating film, a portion of the third insulating film being located on the electrode extension part.

12. The device according to claim 1, wherein the conductive part is a metal layer.

13. The device according to claim 1, wherein the conductive part includes at least one selected from a group consisting of Al, Ti, TIN, TiW, WN, Pt, Ni, In, and Au.

14. The device according to claim 1, wherein the first direction is perpendicular to the upper surface of the horizontal contact region, and a length of the horizontal contact region along the second direction is greater than a length of the conductive part along the first direction.

15. A method for manufacturing a semiconductor device, the method comprising:

forming a conductive part on a portion of a second semiconductor layer, the second semiconductor layer being located on a first semiconductor layer, the first semiconductor layer including a nitride semiconductor, the second semiconductor layer including a nitride semiconductor;

forming an insulating part on a first portion of the conductive part;

forming a first electrode, the first electrode including an electrode part positioned on the second semiconductor layer, the electrode part contacting the second semiconductor layer and the conductive part, and an electrode extension part positioned on the insulating part, the electrode extension part extending in a second direction from an upper end of the electrode part, the second direction being perpendicular to a first direction, the first direction being from the first semiconductor layer toward the second semiconductor layer;

forming a second electrode separated from the first electrode and the conductive part in the second direction, a length along the second direction from the electrode part to an end portion of the conductive part at the second electrode side being greater than a length along the second direction from the electrode part to an end portion of the electrode extension part at the second electrode side; and forming a third electrode positioned above the second semiconductor layer with an insulating film part interposed, the third electrode being positioned between the first electrode and the second electrode-, wherein the electrode part contacts an upper surface of a portion of the conductive part and contacts the upper surface of the second semiconductor layer, and the upper surface of the conductive part includes an edge facing the electrode part in the second direction and a horizontal contact region extending in the second direction from the edge towards the second electrode, and both the edge and the horizontal contact region are in direct contact with the electrode part.

16. The method according to claim 13, wherein the forming of the conductive part includes:

forming a conductive film on the second semiconductor layer; and removing a portion of the conductive film by wet etching.

17. The method according to claim 15, wherein the forming of the insulating part includes:

forming an insulating film on the second semiconductor layer and the conductive part so that the insulating film covers the conductive part; and forming an opening in the insulating film by removing a portion of the insulating film, and the forming of the first electrode includes forming a portion of the electrode part in the opening.

18. A semiconductor device, comprising:

a first semiconductor layer including a nitride semiconductor;

a second semiconductor layer located on the first semiconductor layer, the second semiconductor layer including a nitride semiconductor;

a first electrode located on the second semiconductor layer, the first electrode including an electrode part contacting the second semiconductor layer, and an electrode extension part extending from an upper end portion of the electrode part in a second direction perpendicular to a first direction, the first direction being from the first semiconductor layer toward the second semiconductor layer;

a second electrode located on the second semiconductor layer, the second electrode being separated from the first electrode in the second direction;

a conductive part positioned between the first electrode and the second electrode, the conductive part contacting an upper surface of the second semiconductor layer and contacting the first electrode, a length along the second direction from the electrode part to an end portion of the conductive part at the second electrode side being greater than a length along the second direction from the electrode part to an end portion of the electrode extension part at the second electrode side;

an insulating part located on the conductive part and positioned between the conductive part and the electrode extension part; and a third electrode positioned above the second semiconductor layer with an insulating film part interposed, the third electrode being positioned between the first electrode and the second electrode, wherein a plurality of the first electrodes is provided, a plurality of the conductive parts is provided, the plurality of conductive parts respectively contacts the plurality of first electrodes, one of the plurality of the first electrodes has a first end and a second end in a third direction perpendicular to the first direction and the second direction, one of the plurality of the conductive parts has a third end and a fourth end in the third direction, as viewed from above, the first end and the second end are located between the third end and the fourth end.

* * * * *